United States Patent [19]

Yool

[11] 4,257,003
[45] Mar. 17, 1981

[54] WIDE RANGE FREQUENCY COUNTER

[75] Inventor: George M. Yool, Tempe, Ariz.

[73] Assignee: Ma-West, Inc., Apache Junction, Ariz.

[21] Appl. No.: 893,497

[22] Filed: Apr. 4, 1978

[51] Int. Cl.³ .............................................. G01R 23/02
[52] U.S. Cl. ................................. 324/78 D; 340/715; 364/707
[58] Field of Search .................. 340/715, 811, 377; 324/78 D, 79 D, 186; 235/92 EA, 92 CT, 92 DE, 92 MT; 364/707; 328/15, 25; 307/225 R; 315/380, 384, 386; 325/455

[56] References Cited

U.S. PATENT DOCUMENTS

| | | | |
|---|---|---|---|
| 3,548,403 | 12/1970 | Johnson | 340/715 |
| 3,769,583 | 10/1973 | Spencer | 324/78 D |
| 3,773,038 | 11/1973 | Smith | 324/78 D |
| 3,928,960 | 12/1975 | Reese | 364/707 |

OTHER PUBLICATIONS

Robert L. Allen, Frequency Divider Extends Automatic Digital Frequency Measurement to 12.4 Ghz., Apr. 1967, pp. 2-7, Hewlett-Packard J.
Hewlett-Packard Catalog, 1975, Electronic Instruments and Systems, Electronic Counters, 5300 Measuring System, pp. 270-271.

*Primary Examiner*—Michael J. Tokar
*Attorney, Agent, or Firm*—Harry M. Weiss

[57] ABSTRACT

This disclosure relates to a wide range frequency counter which functions as a highly accurate four range portable frequency counter. Accurate timing intervals of the frequency counter are obtained from a crystal controlled clock oscillator preferably operating at 5.24288 Mhz installed in a temperature controlled oven operating preferably at 65 degrees C. A seven figure LED digital display is used as the visual readout. The first "on" position of a range selector switch consists of a basic 5 Mhz counter which can count from less than 20 hertz to 5 Mhz. The basic counter is used with several combinations of integrated circuit (IC) prescalers to provide three other full-scale counting ranges. The frequency counter uses rechargeable batteries and has current-saving features to allow a useful operation period of six hours in the portable internally powered mode. A self-contained rectifier/voltage regulator combination not only allows the batteries to be recharged but also permits the frequency counter to be operated as a bench unit from an external transformer which is plugged into an AC power outlet.

31 Claims, 6 Drawing Figures

WIDE RANGE FREQUENCY COUNTER

BACKGROUND OF THE INVENTION

1. Field of the Invention

This invention relates generally to frequency counters having electronic circuits especially dedicated to measurement of the frequency of external alternating voltages, and more particularly, to battery operated frequency counters having electronic circuits which can count input frequencies of at least one thousand one hundred megahertz (1.1 Ghz).

2. Description of the Prior Art

Before digital frequency counters became relatively inexpensive and practical, high frequency measurement usually involved comparison of an accurately known frequency with an unknown frequency through usage of an interpolation oscillator or other transfer means. A popular prior and present method of frequency measurement used or uses a high frequency multivibrator which was or is locked on to a highly stable and accurately calibrated crystal controlled oscillator having an oscillation frequency of from 50 to 100 kilohertz. The output of the multivibrator containes a multiplicity of frequencies harmonically related to the source oscillator which can be used for comparison with an unknown frequency subject to correct identification of the harmonic frequency of interest.

A classical prior measurement method which does not require comparison with a reference for use at very high frequencies (VHFs) and ultra high frequencies (UHFs) consists of measurement of current or voltage minima on energized open wire transmission lines, so-called lecher wires, slotted coaxial lines or plug adjusted cavities or wave guide sections. These devices are actually wave meters, but the measurements are related to frequency as follows:

$$f \text{ in hz equals } \frac{3 \times 10^8}{\text{wavelength in meters}}.$$

Where the propagation velocity on low-loss lines or in cavities was known, a measurement accuracy of about 2% was possible at UHFs.

Frequency meters for use at power line frequencies (50–60 Hz) usually consisted of crossed coil discriminators with one coil resonant above the frequency of interest and one coil resonant below the center frequency driving a soft iron indicator element.

Vibrating reed-type frequency indicating instruments are also known and widely used. In a resonant reed instrument, the reeds are mounted horizontally behind a viewing window. The reeds are driven by a common coil and, if the reeds are polarized or magnetically biased, they are adjusted to resonate at selected intervals above and below a center frequency of interest. If no polarizing magnet is used, the reeds are configured to vibrate at twice excitation frequency. Popular center frequencies for reed frequency meters are 25, 50, 60 and 400 hertz. Reed frequency meters are widely used on portable generating equipment and on special purpose frequency changers. Accuracies of from 1 hertz to 0.1 hertz are common.

A Wien bridge provides another convenient method of frequency measurement over the audio range up to 30 or 40 kilohertz. Use of a low-pass filter in the null detector circuit of the Wien bridge avoids the masking effect of harmonics of the fundamental frequency to provide an accuracy of one percent.

Prior art frequency meter devices or techniques should not be used to count frequencies, but only to provide a comparison with a known frequency. Prior frequency counting techniques involved the accumulation of an unknown number of cycles of an alternating voltage or pulses of a square voltage wave form within an accurately denominated time period such as one second and then digitally display the resulting total.

One class of prior frequency counters used electromechanical techniques comprising a polarized reed relay and a high speed mechanical accumulator gated by a mechanical stop clock with a counting capability of up to 500 hertz. These devices were used as interpolators for comparing an unknown with a known frequency, as tachometers and as events counters.

Modern digital frequency counters based on the use of integrated circuit devices or technology are flexible instruments with measurement capability from a few hertz to megahertz frequencies. However, These prior digital frequency counters could not be made portable (battery operated) and count frequencies in excess of about 100 megahertz.

Renewed interest in UHF television and new FCC allocations of communication and amateur bands above 800 Mhz has demonstrated a need for accurate frequency counting or measurements up to 1000 Mhz and beyond. Accordingly, a need existed for a portable (battery operated) highly accurate, digital frequency counter which could count frequencies to at least 1.1 Ghz.

SUMMARY OF THE INVENTION

Accordingly, it is an object of this invention to provide an improved frequency counter with a measurement capability to at least 1.1 Ghz.

It is another object of this invention to provide an improved hand held or battery operated frequency counter of high accuracy capable of operating up to six hours away from a plug-in power source.

It is still another object of this invention to provide a portable (battery operated) frequency counter which has a measurement capability to at least 1.1 Ghz.

It is a further object of this invention to provide an improved frequency counter that can be either used in a battery operated mode or can be operated from an AC power line and measure frequencies in either mode to at least about 1.1 Ghz.

It is a still further object of this invention to provide an improved frequency counter having time base stability of better than 1 part in $10^8$ per 24 hours and providing a long-term counter accuracy of at least $10^{-7}$ or one count of the least significant digit on the 5 Mhz range.

The foregoing, and other objects, features, and advantages of the invention will be apparent from the following, more particular description of the preferred embodiment of the invention, as illustrated in the accompanying drawing.

Figure 1:
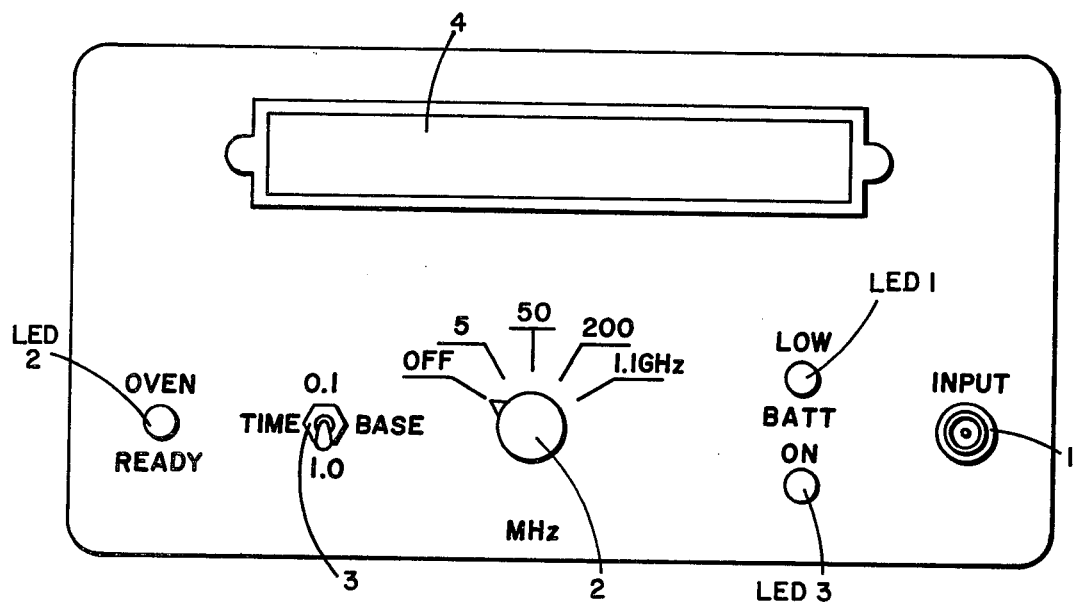
FIG. 1 is a front elevational view of the frequency counter drawn to approximately actual size showing LED indicator lights, controls and the readout register or display.

Referring to the frequency counter shown in FIG. 1, a radio frequency (RF) or audio frequency (AF) input 1 is a BNC coaxial bulkhead connector jack. The AC coupled input signal to be supplied to the input 1 that is required to operate the frequency counter throughout its four ranges preferably should average 205 millivolts at 50 ohms although it may be as low as 2 millivolts at 50 Mhz and as high as 0.8 volts at 1.1 Ghz.

A counter range selection switch 2 also serves as the "on" and "off" switch. The four selectable frequency ranges of the counter selected by the counter range selection switch 2 are to 5 Mhz, 50 Mhz, 200 Mhz and 1.1 Ghz (1,100 megahertz). The range selector switch 2 is shown in the "off" position in FIG. 1.

A time base selector switch 3 permits the frequency counter sampling rate to be optionally adjusted to either one second or one-tenth second intervals. A preferably seven digit in-line LED frequency readout 4 is used as the digital display of the frequency counted by the frequency counter of FIG. 1.

Three LED indicator lights shown as LED 1, LED 2 and LED 3 are used to indicate the status of several counter functions. LED 1 is a low battery indicator which comes on when the battery voltage (Vcc) drops to 4.1 volts. When the battery is being charged, LED 1 is not extinguished until Vcc reaches 4.5 volts. LED 2 is an oven-ready light which comes on when the proportionally controlled crystal oven (shown in FIG. 2 and referred to in more detail in FIG. 3B) has reached its normal operating temperature of 65 degrees C. LED 3 is an "on" and "off" indicator light which also serves as a time base selector indicator. When the 1 second time base is selected at the time base selector switch 3, LED 3 comes on once every other second. On the one-tenth second time base selector position of the switch 3, LED 3 comes on five times per second. When LED 3 is lit, the input voltage is being counted. During the "off" periods of LED 3, the resulting frequency count is being displayed by the LED readout display 4.

Figure 2:
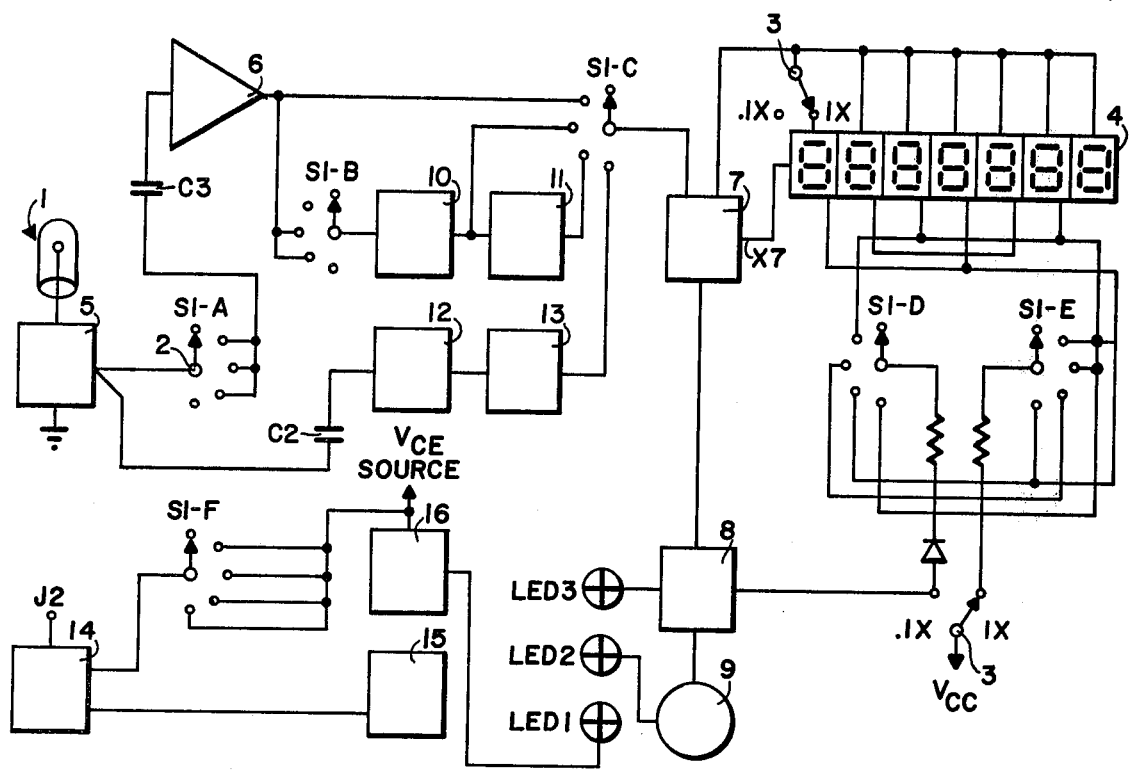
FIG. 2 is substantially a block diagram of the electronic portion of the frequency counter of FIG. 1 showing the relationship and function of the various circuit elements.

Referring to the block diagram of FIG. 2, the RF (or AF) input 1 to the frequency counter is shown as a BNC connector. The frequency counter is protected from extraneous voltages and excessive inputs by protective diodes contained in block 5. The four counter frequency ranges (5 Mhz, 50 Mhz, 200 Mhz and 1.1 Ghz) including the "off" position of the switch 2 are selected by a six-layer, five-contact, non-shorting range selector switch whose six-layers are desisnated by S1-A through S1-F (see FIGS. 3A and 3B).

Figure 3A:
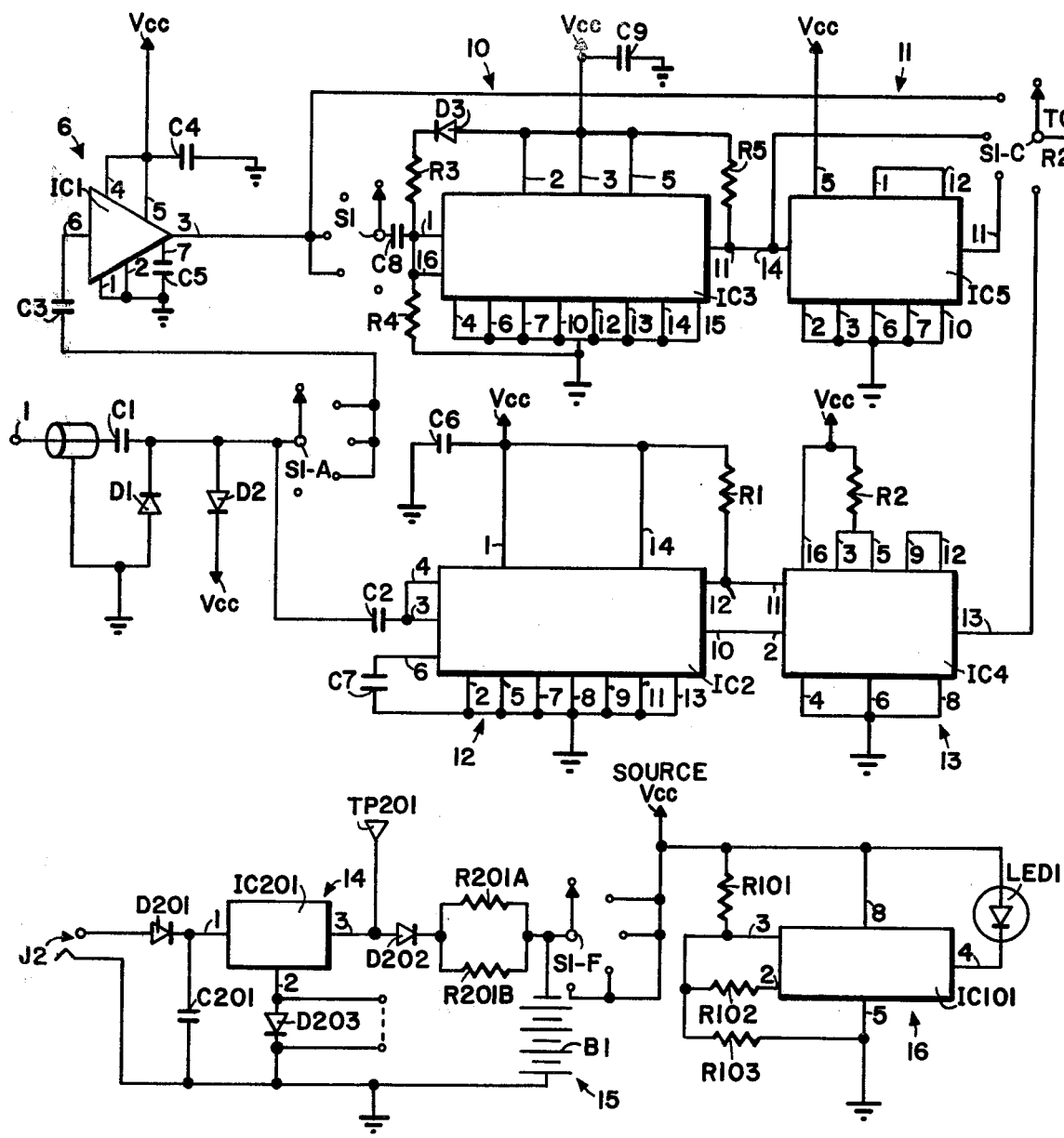
FIGS. 3A and 3B are detailed circuit diagrams which together comprise the frequency counter shown in block diagram form in FIG. 2 showing interconnections of the integrated circuits and other electronic components used in the counter.

The second, third and fourth contacts of switch S1-A are connected through capacitor C3 (0.01 uf) to a wide band op-amp 6 whose bandwidth is 300 Mhz (see FIGS. 2 and 3A). The output of the op-amp 6 is connected to the second contact of the switch S1-C (5 Mhz frequency counter range). The rotary or center contact of the switch S1-C is connected to the input of a 5 Mhz counter 7 which is clocked by a crystal oscillator 8 which is in turn driven by a crystal and oven combination 9. Oven 9 also drives the oven ready light LED 2. The crystal oscillator (which is an IC) 8 drives LED 3 (the off-on pilot light).

The outputs of the counter 7 drive the cathode and anode segments of the seven-digit LED indicator 4 (see also FIG. 1). When switch S1- (A through F) is on contact 3 (the 50 Mhz range), a divide by ten prescaler integrated circuit 10 is switched into the circuit combination. When switch S1- (A through F) is on contact 4, an additional divide by ten integrated circuit 11 is switched in thereby extending the counter range to 200 Mhz.

When the range switch S1- (A through F) is switched to contact five, then frequency divider integrated circuit units 12 and 13 are switched into the circuit. The combination of IC units 12 and 13 result in a divide by 1000 counter which functions on the 1.1 Ghz range (1,100 Mhz) of the counter. Switch sections S1-A and S1-B play no part in selection of the 1.1 Ghz range, but switch section S1- (C through F) are operational. The input to the 1.1 Ghz prescaler (IC units 12 and 13) is directly connected to the protective diodes contained in block 5 through a 1000 pf capacitor C1 which has negligible, if any, effect on the other ranges of the counter. The output of the 1.1 Ghz prescaler (IC units 12 and 13) is connected to the counter 7 via contact 5 on switch S1-C. Switch sections S1-D and S1-E are connected to indicate decimal point locations on the LED digital readout 4 for each setting of the range switch S1- (A through F) (see reference numeral 2 in FIG. 1) and for both (1X and 0.1X) settings of the time base switch 3 (see also reference numeral 3 in FIG. 1).

Block 14 depicts the combination battery charger and voltage regulator IC. A minimum seven and one half volts AC input at J2 (FIG. 2) is required for the correct operation of the battery charger 14. An internal battery 15 which powers the frequency counter preferably consists of four D-size, Ni-Cd cells. The IC which operates the low battery (indicator) LED 1 is shown at 16. Switch S1-F connects the battery 15 and voltage regulator and battery charger 14 to Vcc on all switch settings except on contact one.

GENERAL DETAILS OF THE COUNTER CIRCUITS

Figure 3B:
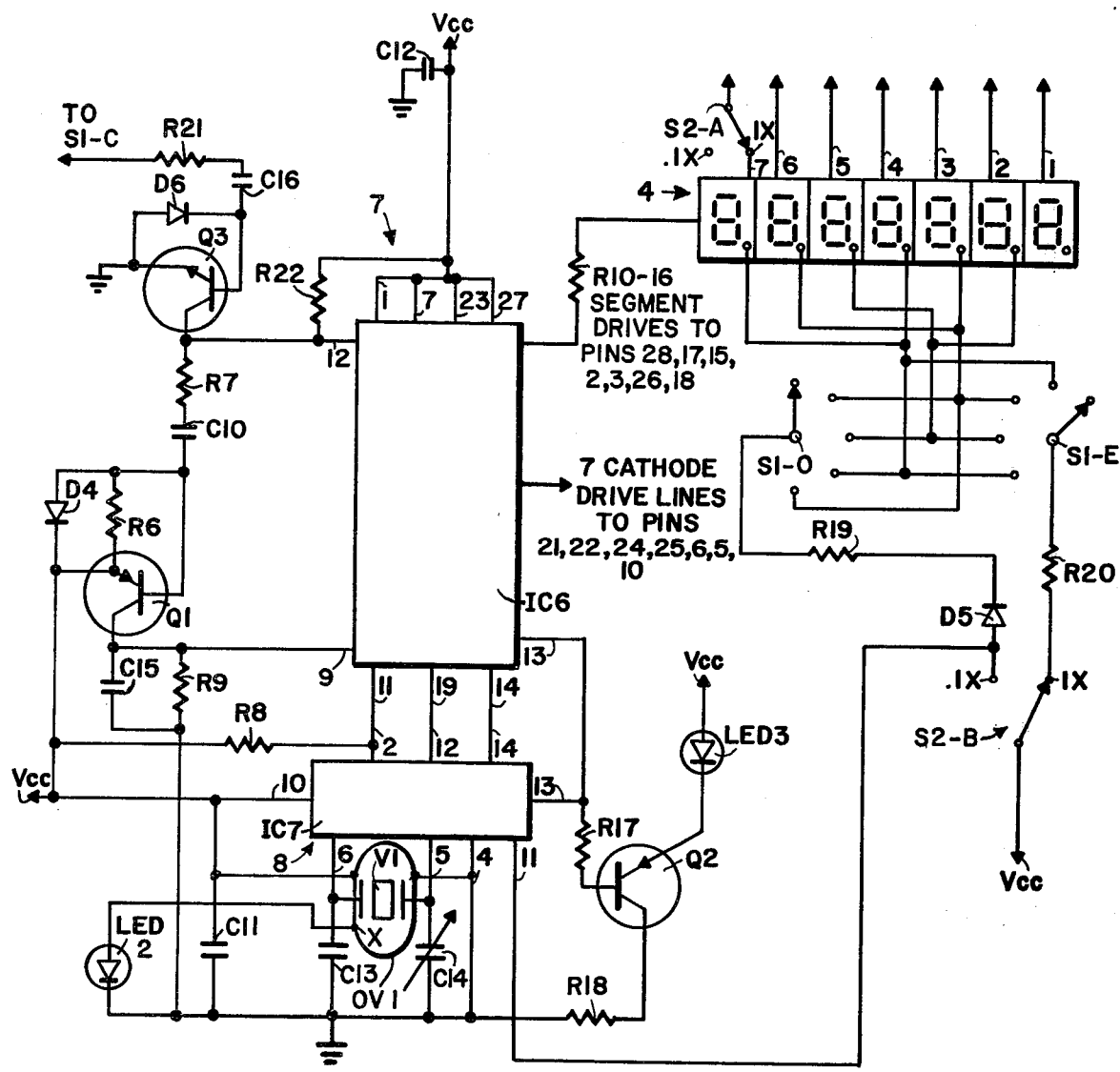

FIGS. 3A and 3B are a detailed schematic diagram of the 1.1 Ghz frequency counter showing components, IC units and pin-out connections on the currently used ICs. All capacitors are preferably rated at 50 volts, except where noted otherwise below.

Referring to FIG. 3A, the center conductor of the BNC RF/AF input jack 1 (see reference numeral 1 in both FIGS. 1 and 2) is connected to the cathode end of diode D1 (a 1N914 diode) and the anode end of diode D2 (also a 1N914 diode) through capacitor C1 (0.1 uf 250 volt rating). The anode of diode D1 is connected to ground and the cathode of diode D2 is connected to Vcc. The common point of diodes D1 and D2 and capacitor C1 is also connected to the rotary or center contact of the range selector switch S1-A. Another conductor from the common point of the diodes D1, D2 and the capacitor C1 is connected to pins 3 and 4 of IC 2 through 0.001 uf capacitor C2.

The first contact of range selector switch S1-A through S1-F is blank and serves as the "off" position of the frequency counter (see the pointer position of the switch 2 of FIG. 1).

The second, third and fourth contacts of the range selector switch S1-A are connected through capacitor C3 (0.01 uf) to pin six of IC 1, which is preferably a Plessy-type SL 560C wide band operational amplifier, with useful gain to 300 Mhz. Pins 1 and 2 of IC 1 are connected to ground, pin 7 is connected to ground through capacitor C5 (0.01 uf). Pins 4 and 5 of IC 1 are connected to Vcc. Capacitor C4 (0.1 uf) is connected to ground from the common connection of pins 4 and 5. The output of IC 1 is pin 3. Pin 3 of IC 1 is connected to terminal two of the range selector switch S1-C. Pin 3 of IC 1 is also connected to terminals 3 and 4 of the range selector switch S1-B. IC 1 will with the components attached thereto (except for C 3 ) provide the op-amp function of block 6 of FIG. 2.

THE BASIC COUNTER CIRCUIT

The rotary or center contact of the range selector switch S1-C is connected to the input to the basic 5 Mhz counter (which comprises the circuit arrangement of FIG. 3B) as shown in FIG. 3B. This counter circuit comprises integrated circuit IC 6 (within block 7) which is preferably an Intersil-CMOS-type ICM 7208I PI component, and IC 7 which is a crystal controlled master clock circuit such as the intersil-type ICM 7207 AI PD. IC 6 is a 28 pin LSI chip which contains all the circuitry necessary for counting, latch, decode and drive functions and which interfaces directly with the seven digit multiplex connected LED readout 4 (which is a Fairchild-type FND 5065). The same basic counter circuit as shown in FIG. 3B is used for all frequency ranges. Thus, the rotary or center contact of range switch S1-C (see FIG. 3A) is connected to the basic counter circuit input on all range settings. NPN transistor Q3 (see FIG. 3B) which is preferably a Fairchild 2N5770, is used ahead of the basic counter (IC 6) as a signal processor and conditioner. The rotary or center contact of range selector switch S1-C (see FIG. 3A) is connected to the base of transistor Q3 through resistor R21 (one kilo-ohm) and capacitor C16 (0.01 uf). The base of Q3 is also connected to ground through diode D6 (which is a 1N 914 diode) whose cathode is connected to the base of Q3 and the anode is connected to ground. With a shunt diode (D6) on the base and no bias, transistor Q3 amplifies only the positive going halves of the input signal and suppresses negative input signals. The emitter of Q3 is connected to ground and the collector is connected to pin 12 of IC 6. Resistor R22 (470 ohms) serves as a load resistor for Q3 and is connected between the connection from the collector of Q3 and pin 12 of IC 6 and Vcc. Vcc is also connected to pins 1, 7, 23 and 27 of IC 6. Capacitor C12 (0.1 uf) is connected from the Vcc input to IC 6 and ground.

PNP transistor Q1, which is preferably a Motorola MPSA63, is used to blank out the digit display 4 by acting on pin 9 of IC 6. The base of Q1 is connected to the collector of Q3 through resistor R7 (4.7 kilo-ohms) and through capacitor C10 (0.1 uf). The base of transistor Q1 is also connected to its emitter through resistor R6 (1meg-ohm) shunted by diode D4 (which is preferably a 1N 914 type diode) with its anode connected to the base of Q1 and its cathode connected to the emitter. The emitter of transistor Q1 is also connected to pin 9 of IC 6 and to ground through resistor R9 (100 kilo-ohms) shunted by capacitor C15 (0.01 uf). The digit display 4 is only energized upon a signal being applied to input 1. Capacitor C15 prevents blinking of the digit display 4 when low frequencies are being connected. The blanking of the digit display 4 during the no signal phase results in a considerable saving of current drain. Pin 11 of IC 6 is connected to pin 2 of IC 7 and also to Vcc through resistor R8 which is a 1 kilo-ohm resistor. Pin 19 of IC 6 is connected to pin 12 of IC 7. Pin 14 of IC 6 is connected to pin 14 of IC 7. Pin 13 of IC 6 is connected to pin 13 of IC 7. Pin 13 of IC 7 is also connected to the base of PNP transistor Q2 (which is preferably a Motorola MPSA63) through resistor R 17 (4.7 kilo-ohms). The collector of Q2 is connected to ground through resistor R 18 (470 ohms). The emitter of transistor Q2 is connected to Vcc through the light emitting diode LED 3 (see also FIGS. 1 and 2), which is preferably a Fairchild FLV440. The cathode of LED 3 is connected to the emitter of Q2. LED 3 is switched on and off by the timing intervals produced by IC 7 which is connected to and controls IC 6. LED 3 flashes on once every other second when switch S2-B is set for a one second (1X) timing interval. LED 3 flashes on five times per second when S2-B is set for a one-tenth second (0.1X) timing interval. Thus, LED 3 serves as an off-on pilot and indicates the mode it is in by the flashing sequence at the time base selection switch 3.

Seven pins 2, 3, 15, 17, 18, 26 and 28 of IC 6 (only one of which is shown) drive the seven segments of the seven digit LED frequency readout 4 through seven segment drive resistors R10 to R16 (27 ohms). Seven pins 5, 6, 10, 21, 22, 24 and 25 of IC 6 are connected to the cathodes (by connections not shown) of the seven-digit LED display 4. Switch S2-A disconnects the cathode of digit seven of the display 4 to suppress the leading zero when the time base switch 3 (FIG. 1) is switched to the one-tenth second position, resulting in a further reduction of current drain. The center contact of S2-B is connected to Vcc. The switch 3 of FIGS. 1 and 2 is the same as the toggle switch S2-B of FIG. 3B. The one-tenth second time interval position of the switch 3 (FIG. 1) or the switch S2-B of FIG. 3B is connected to pin 11 of IC 7 and to the center or rotary contact of the range selector switch S1-D through diode D5 (which is a 1N4001 type diode) and resistor R19 (27 ohms). The anode of D5 is connected to the one-tenth second contact of switch S2-B. The one second contact of switch S2-B is connected to the center or rotary contact of switch S1-E through resistor R20 (27 ohms). The function of switches S1-D and S1-E is to correctly locate the decimal point on the seven-digit frequency readout 4 for various range selector settings. The function of diode D5 is to isolate the two sets of readout decimal points and pin 11 of IC 7. Contact one of range switches S1-D and S1-E are blank corresponding to the "off" position of the switch 2 (see FIG. 1) of the frequency counter. The contact in position two of switch S1-D is connected to the contact in position three of switch S1-E and to decimal points in digits 3 and 6 of the seven-digit frequency display 4. The contact in position three of switch S1-D is connected to the contact in position four of switch S1-E and to the decimal points in digit two and digit five of the seven-digit frequency display 4. The contact in position four of switch S1-D is connected to the contact in position five of switch S1-E and to contact two of switch S1-E and to decimal points in digits four and seven of the LED frequency readout 4. The contact in position five of switch S1-D is connected to contact two of switch S1-D and contact 3 of switch S1-E and to decimal points three and six of the LED frequency readout.

Integrated circuit IC 7 functions as a time base generator and works in conjunction with IC 6 to provide gating intervals for the basic 5 Mhz frequency counter.

Pin 4 of IC 7 is connected to ground. Pin 5 of IC 7 is connected to ground through variable capacitor C14 (which is a 5 to 30 pico fared NPO adjustable ceramic capacitor). Pin 6 of IC 7 is connected to ground through capacitor C 13 (which is a 22 pico farad NPO ceramic capacitor). Quartz crystal VI (which is a 5.24288 Mhz crystal oscillator ±0.002% at 65° C.) is connected between pin 5 and pin 6 of IC 7. Pin 10 of IC 7 is connected to Vcc. Capacitor C11 (0.1 uf) is connected between pin 10 of IC 7 and ground.

Crystal VI is installed in crystal oven OV1. The current input to the oven OV1 does not cycle on and off because it is proportional to oven temperature. The crystal oven OV1 reaches a low current input value for temperature maintenance at 65° C. The crystal oven OV1 is preferably an Oven Aire type PCL 1-38-02. The plus terminal of the crystal oven OV1 is connected to Vcc and the minus terminal is grounded. The X terminal of the crystal oven OV1 is connected to ground through the light emitting diode LED 2 (which is a Fairchild FLV340). The light emitting diode LED 2 comes on when the crystal oven OV1 reaches 65° C., thus, assuring the user of the frequency counter that the crystal V1 is at calibration temperature. The basic 5 Mhz frequency counter as described above is used with no change on the other three ranges of the frequency counter.

THE PRESCALER CIRCUITS

Referring to FIG. 3A, contacts two, three and four of the range switch S1-A are connected to the input of the wide band op-amp IC 1. Thus, IC 1 is used on the 5 Mhz, 50 Mhz and 200 Mhz ranges. Contacts one and two of the range switch S1-B are blank because the output of IC 1 is connected directly to the input of the 5 Mhz counter at contact two of switch S1-C. The output of IC 1 (pin 3) is also connected to contact 3 and 4 of the range switch S1-B. The center or rotary contact of the range switch S1-B is connected to pins 1 and 16 of IC 3 (which is a Plessey SP8646/SP component) through capacitor C8 (0.01 uf). Pins 1 and 16 of IC 3 are connected to ground through resistor R4 (470 ohms) and to Vcc through Resistor R3 (56 ohms) and diode D3 (diode type 1N914). The anode of the diode D3 is connected to Vcc. Pins 2, 3 and 5 of IC 3 are also connected to Vcc. Pin 11 of IC 3 is also connected to Vcc through resistor R5 (2 kilo-ohms). The Vcc conductor to IC 3 is connected to ground through capacitor C9 (0.1 uf). Pins 4, 6, 7, 10, 12, 13, 14 and 15 of IC 3 are connected to ground. Pin 11 of IC 3 is connected to pin 14 of IC 5 and to contact 3 of the range switch S1-C. At contact 3 of the range switch S1-C, IC 3 divides the input signal by ten and extends the counter range to 50 Mhz.

Position four (contact four) of range switch S1-A through S1-F sets the frequency counter up for the two hundred Mhz full-scale range. Contacts 2, 3 and 4 of switch S1-A are paralleled. Contacts 3 and 4 of switch S1-B are paralleled. Contact 4 of switch S1-C is connected to pin 11 of IC 5 (which is a Fairchild 9LS90 component). The input of IC 5 (pin 14) is driven by pin 11 of IC 3. Pins 2, 3, 6, 7 and 10 of IC 5 are grounded. Pin 1 is connected to pin 12 and pin 5 of IC 5 is connected to Vcc. IC 3, as mentioned earlier, is a divide by ten circuit so a 200 Mhz input signal emerges as a 20 Mhz signal. IC 5 is a high-speed circuit using transistor-transistor logic (TTL) which is connected to divide by ten so that the maximum frequency input to the basic counter (FIG. 3B) is 5 Mhz.

The 1.1 Ghz range of the frequency counter operates independently of the 50 Mhz and 200 Mhz prescaler combinations. Integrated circuit IC 2 (preferably a Fairchild 11C83 component) operates in conjunction with IC 4 (preferably a Fairchild 9LS161 component). Pins 3 and 4 of the integrated circuit IC 2 are connected to the center or rotary contact of the range selctor switch S1-A and to the cathode/anode common point of protective diodes D1/D2 through C2 (a 0.001 uf capacitor). As previously mentioned, this connection has negligible or no effect on the operation of the other counter range settings. Pins 2, 5, 7, 8, 9, 11 and 13 of the integrated circuit IC 2 are connected to ground. Pin 6 of the integrated circuit IC 2 is connected to ground through capacitor C7 (0.1 uf). Pins 1 and 14 of the integrated circuit IC 2 are connected to Vcc. The Vcc input to the integrated circuit IC 2 is connected to ground through capacitor C6 (0.1 uf). Vcc is connected to pin 12 of the integrated circuit IC 2 through resistor R1 (2 kilo-ohms). Pin 12 of the integrated circuit IC 2 is connected to pin 11 of the integrated circuit IC 4 and pin 10 of IC 2 is connected to pin 2 of integrated circuit IC 4. Pins 4, 6 and 8 of the integrated circuit IC 4 are connected to ground and pins 3 and 5 are connected to Vcc through resistor R2 (1 kilo-ohm). Pins 9 and 12 of the integrated circuit IC 4 are connected together. Pin 16 of IC 4 is connected to Vcc. Pin 13 of the integrated circuit IC 4 is connected to contact 5 (position 5) of switch S1-C, thus, position 5 of range switch S1-C activates the 1.1 Ghz counter circuit which comprises the integrated circuits IC 2 and IC 4 which work together as a counter circuit. The combination of these integrated circuits (IC 2 and IC 4) divide the incoming frequency by 248 three times in succession, followed by a fourth countdown of 256, giving an overall frequency division ratio of 1000.

THE POWER SUPPLY CIRCUITS

FIG. 3A also shows the power supply details of the frequency counter. The basic power source preferably comprises four size "D" series-connected, nickel cadmium rechargeable cells B1. The battery positive lead is connected to the Vcc loads through the center or rotary terminal of the switch S1-F. The negative lead of the battery B1 is connected to ground. Terminal 1 of the switch S1-F is blank for the "off" position and terminals 2 through 5 are connected in parallel to the Vcc inputs of the various integrated circuits in the counter. The parallel connected terminals of the switch S1-F are also connected to pin 8 of integrated circuit IC 101 (which is preferably an Intersil ICL8211CPA) and drives the low-battery-indicator LED 1. The anode of light emitting diode LED 1 (which is preferably a Fairchild FLV140 component) is connected to Vcc. The cathode of the light emitting diode LED 1 is connected to pin 4 of the integrated circuit IC 101.

Pin 5 of integrated circuit IC 101 is connected to ground and pin 3 is connected to Vcc through resistor R101 (430 kilo-ohms) and to ground through resistor R103 (150 kilo-ohms). Pin 2 of integrated circuit IC 101 is connected to pin 3 through resistor R 102 (4.7 meg-ohms). As mentioned above, the light emitting diode LED 1 comes on when the battery voltage drops to 4.1 volts, but is not extinguished until the battery voltage is charged to 4.5 volts due to a voltage hysteresis feature built into integrated circuit IC 101.

The positive terminal of battery B1 is connected to pin 3 of integrated circuit IC 201 (which is preferably a Fairchild 7806CP component) through parallel-connected resistors R201A and R201B (1 ohm, ½ watt each) and diode D202 (which is a 1N4001 type diode). Pin 3 of integrated circuit IC 201 is also connected to test point TP 201. Pin 1 of integrated circuit IC 201 is connected to the center insulated terminal of jack J2 through diode D201 (which is preferably a 1N4001 type diode). The external shell of jack J2 is grounded. The positive terminal of capacitor C201 (1000 uf, 16 volts) is connected to the lead between the cathode of diode D201 and pin 1 of integrated circuit IC 201. The negative terminal of capacitor C201 is connected to ground. Pin 2 of integrated circuit IC 201 may be grounded, but if the voltage at test point TP201 is less than 6 volts, diode D203 (which is preferably a 1N4001 type diode) will be installed between pin 2 and ground with the cathode end of diode D203 grounded. Integrated circuit IC 201 functions as a battery charger current regulator which is energized through jack J2 by an external plug-in-type 7.5 volt AC, 1 ampere charger transformer (not shown).

ALTERNATE PRESCALER CIRCUITS

Figure 4A:
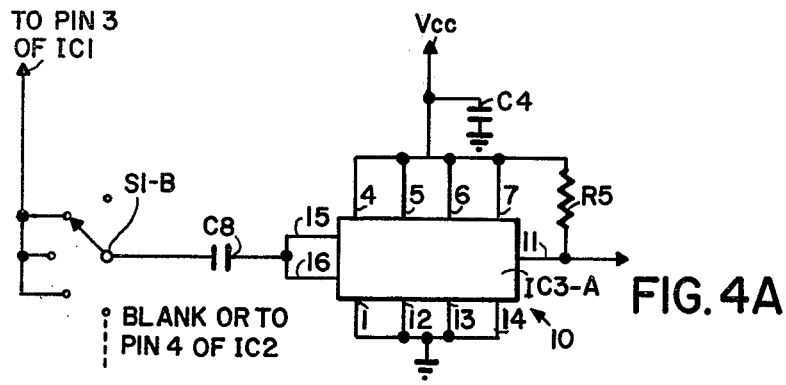
FIGS. 4A and 4B are circuit diagrams of features of the circuit portion of the frequency counter of FIG. 3A showing the use of alternate types of integrated circuits in two of the prescaler positions.

FIG. 4A shows pin-out numbers if a Fairchild-type 11C90 integrated circuit is substituted for the Plessy SP8646/7P in place of the integrated circuit IC 3 as shown in FIG. 3A.

The center or rotary terminal of the range selector switch S1-B is connected to pins 15 and 16 of alternate integrated circuit IC 3A through capacitor C8 (0.01 uf). Pins 1, 12, 13 and 14 of integrated circuit IC 3A are grounded. Pins 4, 5, 6 and 7 of integrated circuit IC 3A are connected to Vcc. Pull-up resistor R5 (10 kilo-ohms) is connected between pin 11 of integrated circuit IC 3A and Vcc. Pin 11 of integrated circuit IC 3 is connected to pin 14 of integrated circuit IC 5 (see FIG. 3A) when this alternate embodiment is used. Capacitor C4 (0.1 uf) is connected between the Vcc inputs to integrated circuit IC 3A and ground. When the Fairchild-type integrated circuit 11C90 (IC 3A) is used in place of the Plessey integrated circuit SP8646/7P (IC 3), the third range of the frequency counter will respond to 600 Mhz instead of 200 Mhz with the Plessey chip.

Figure 4B:
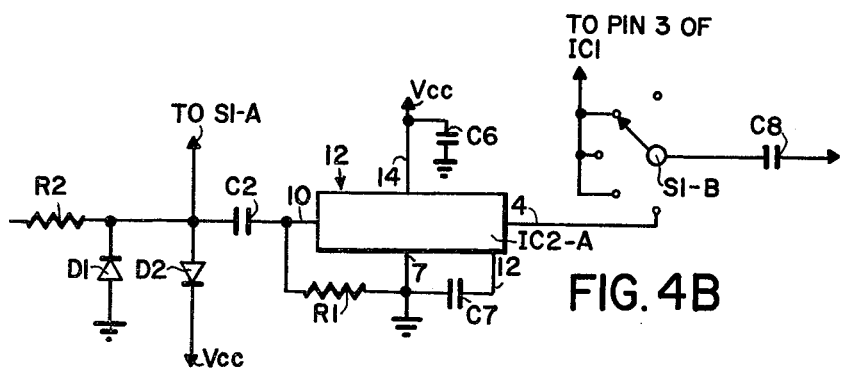

FIG. 4B shows alternate connections of the prescaler circuit used on the fourth range of the counter based on usage of a Plessey-type integrated circuit SP8666/7B (IC 2A) in place of the Fairchild 11C83DC used for integrated circuit IC 2 as shown in FIG. 3A. In this version of the prescaler, integrated circuit IC 4 is not used. Pin 10, the input of integrated circuit IC 2A is connected to the common point of protective diodes D1 and D2 (diode type 1N914s) through capacitor C2 (0.001 uf). Pin 10 of integrated circuit IC 2A is also connected to ground through resistor R1 (15 kilo-ohm). Pin 7 of integrated circuit IC 2A is grounded and pin 12 is connected to ground through capacitor C7 (0.001 uf). Pin 14 of integrated circuit IC 2A is connected to Vcc. The Vcc input is connected to ground through capacitor C6 (0.1 uf). Output pin 4 of integrated circuit IC 2A is connected to contact five of switch S1-B. When the Plessey SP8666/7B (IC 2A) is used for integrated circuit IC 2, the maximum range of the frequency counter in the fourth selector switch position of switch S1-B (or switch 2 of FIG. 1) is 1.4 Ghz (1,400 Mhz).

While the invention has been particularly shown and described in reference to the preferred embodiment thereof, it will be understood by those skilled in the art that changes in the form and details may be made therein without departing from the spirit and scope of the invention. For example, the detailed schematic diagram of the frequency counter prescaler shown in FIG. 3A presently constitute the preferred embodiment of the invention. A change in the cost and availability of the Plessey SP8666/78 (IC 2) could lead to a change in the 1000 Mhz range prescaler to the embodiment shown in FIG. 4B. Usage of the Fairchild 11C90 (IC 3A) for IC 3 could lead to adoption of the circuit shown in FIG. 4A.

What is claimed is:

1. A frequency counter comprising, in combination, a display; frequency counting means connected to said display for counting the frequency of input signals applied to said frequency counter; and control means coupled to said display and said frequency counting means for automatically blanking out said display when there is no input signal applied to said frequency counter and also for permitting said display to display the frequency of said input signal only when an input signal is actually applied to said frequency counter.

2. A frequency counter in accordance with claim 1 including battery means coupled to said frequency counting means and said control means for supplying an energy source for operating said frequency counter.

3. A frequency counter in accordance with claim 1 wherein said frequency counting means comprising crystal means for generating periodic electrical signals at predetermined time intervals.

4. A frequency counter in accordance with claim 3 wherein said crystal means having means for generating periodic electrical signals at either 0.1 second intervals or at 1 second intervals.

5. A frequency counter in accordance with claim 3 including oven means for providing a uniform reference temperature for said crystal means to permit said crystal means to operate with high accuracy and stability.

6. A frequency counter in accordance with claim 5 including means coupled to said oven means for indicating when said oven means was at a desired temperature for the operation of the frequency counter.

7. A frequency counter in accordance with claim 6 wherein said oven temperature indicating means being operable at a temperature in excess of 50° C.

8. A frequency counter in accordance with claim 7 wherein said oven temperature indicating means being operable at a temperature of about 65° C.

9. A frequency counter in accordance with claim 4 including means for blanking out the leading zero in said display when said means for generating periodic electrical signals is generating said signals at 0.1 second intervals.

10. A frequency counter in accordance with claim 4 including single switching means for selecting both generating periodic electrical signals to operate at either 0.1 second intervals or 1 second intervals and for correctly placing a decimal point in said display depending upon a selected frequency range of operation of said frequency counter.

11. A frequency counter in accordance with claim 2 including means connected to said battery means for indicating a low battery charge condition.

12. A frequency counter in accordance with claim 2 including means connected to said battery means for simultaneously charging said battery means and powering said frequency counter.

13. A frequency counter in accordance with claim 12 wherein said charging and powering means comprising current and voltage regulating means for supplying regulated current and voltage to said battery means and said frequency counter.

14. A frequency counter in accordance with claim 1 including battery means coupled to said frequency counting means and said control means for supplying an energy source for operating said frequency counter, said frequency counting means comprising crystal means for generating periodic electrical signals at predetermined time intervals.

15. A frequency counter in accordance with claim 14 wherein said crystal means having means for generating periodic electrical signals at either 0.1 second intervals or at 1 second intervals.

16. A frequency counter in accordance with claim 15 including oven means for providing a uniform reference temperature for said crystal means to permit said crystal means to operate with high accuracy and stability.

17. A frequency counter in accordance with claim 16 including means coupled to said oven means for indicating when said oven means was at a desired temperature for the operation of the frequency counter.

18. A frequency counter in accordance with claim 17 wherein said oven temperature indicating means being operable at a temperature in excess of 50° C.

19. A frequency counter in accordance with claim 18 wherein said oven temperature indicating means being operable at a temperature of about 65° C.

20. A frequency counter in accordance with claim 16 including means for blanking out the leading zero in said display when said means for generating periodic electrical signals is generating said signals at 0.1 second intervals.

21. A frequency counter in accordance with claim 16 including single switching means for selecting both generating periodic electrical signals to operate at either 0.1 second intervals or 1 second intervals and for correctly placing a decimal point in said display depending upon a selected frequency range of operation of said frequency counter.

22. A frequency counter in accordance with claim 20 including single switching means for selecting both generating periodic electrical signals to operate at either 0.1 second intervals or 1 second intervals and for correctly placing a decimal point in said display depending upon a selected frequency range of operation of said frequency counter.

23. A frequency counter in accordance with claim 16 including means connected to said battery means for indicating a low battery charge condition.

24. A frequency counter in accordance with claim 16 including means connected to said battery means for simultaneously charging said battery means and powering said frequency counter.

25. A frequency counter in accordance with claim 24 wherein said charging and powering means comprising current and voltage regulating means for supplying regulated current and voltage to said battery means and said frequency counter.

26. A microwave frequency counter comprising, in combination, a display; and frequency countdown dividing means connected to said display for counting the frequency of input signals applied to said frequency counter, said frequency counting means comprising means for dividing by at least 1,000 the frequency of said input signals, said dividing means comprising emitter coupled logic type integrated circuits.

27. A microwave frequency counter in accordance with claim 26 including battery means coupled to said frequency countdown dividing means for supplying an energy source for operating said frequency counter.

28. In a frequency counter apparatus comprising, in combination, a frequency counter display; and control means coupled to said display for automatically blanking out said display in the absence of an input frequency signal having a sufficient amplitude and within a given frequency range applied to said frequency counter apparatus and also for automatically permitting said display to be visually displayed only when said input frequency signal is applied to said frequency counter apparatus.

29. An apparatus in accordance with claim 28 including battery means coupled to said display and said control means for supplying an energy source for operating said apparatus.

30. An apparatus in accordance with claim 29 including means for simultaneously charging said battery means and powering said apparatus.

31. An apparatus in accordance with claim 29 including means connected to said battery means for indicating a low battery condition.

* * * * *

UNITED STATES PATENT AND TRADEMARK OFFICE
CERTIFICATE OF CORRECTION

PATENT NO. : 4,257,003
DATED : March 17, 1981
INVENTOR(S) : George M. Yool

It is certified that error appears in the above—identified patent and that said Letters Patent is hereby corrected as shown below:

In the Claims:

Claim 1, Line 8, after "for" insert --automatically--

Claim 26, Line 3, delete "counting" and insert --countdown dividing--

Claim 26, Line 5, delete "counting" and insert --countdown dividing--

Signed and Sealed this

Twenty-fifth Day of August 1981

[SEAL]

Attest:

Attesting Officer

GERALD J. MOSSINGHOFF

Commissioner of Patents and Trademarks